United States Patent
Adolf et al.

(10) Patent No.: US 9,671,475 B2
(45) Date of Patent: Jun. 6, 2017

(54) DEVICE, METHOD AND SYSTEM FOR CONTROLLING IMAGING METHODS AND SYSTEMS

(71) Applicant: Siemens Aktiengesellschaft, Munich (DE)

(72) Inventors: Holger Adolf, Zirndorf (DE); Thomas Benner, Erlangen (DE); Hans-Peter Fautz, Forchheim (DE); Joerg Ulrich Fontius, Neunkirchen A. Brand (DE); Rene Gumbrecht, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 567 days.

(21) Appl. No.: 14/228,457

(22) Filed: Mar. 28, 2014

(65) Prior Publication Data

US 2014/0292332 A1    Oct. 2, 2014

(30) Foreign Application Priority Data

Mar. 28, 2013   (DE) .................. 10 2013 205 651

(51) Int. Cl.
  *G01R 33/28*    (2006.01)
  *G01R 33/54*    (2006.01)

(52) U.S. Cl.
  CPC ......... *G01R 33/288* (2013.01); *G01R 33/543* (2013.01)

(58) Field of Classification Search
  CPC .................... G01R 33/288; G01R 33/543
  See application file for complete search history.

(56) References Cited

U.S. PATENT DOCUMENTS

| | | | |
|---|---|---|---|
| 2007/0024283 A1 | 2/2007 | Bielmeier et al. | |
| 2008/0218166 A1 | 9/2008 | Arnold | |
| 2013/0169348 A1* | 7/2013 | Shi | H04B 1/3838 327/517 |
| 2015/0002147 A1* | 1/2015 | Fontius | G01R 33/288 324/309 |
| 2015/0015254 A1* | 1/2015 | Zhu | A61B 5/055 324/309 |
| 2015/0022206 A1* | 1/2015 | Adolf | G01R 33/288 324/309 |

* cited by examiner

*Primary Examiner* — Rodney Bonnette
(74) *Attorney, Agent, or Firm* — Schiff Hardin LLP

(57) ABSTRACT

In a computer-implemented method, device and system for controlling an imaging system, a specific absorption rate is calculated with a computation unit and an RF transmission signal of the imaging system is controlled with a control device. The process of controlling of the RF transmission signal includes disconnecting the RF transmission signal when a remaining period during which the RF transmission signal is harmless for the patient has been reduced to zero.

14 Claims, 2 Drawing Sheets

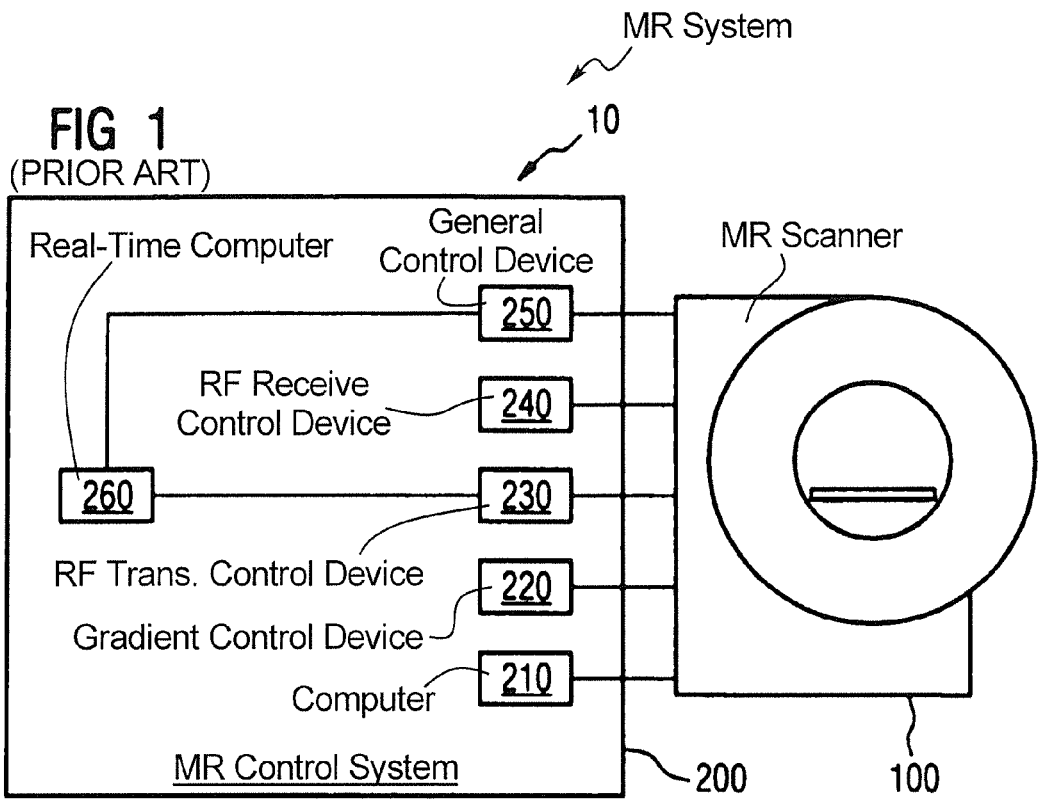
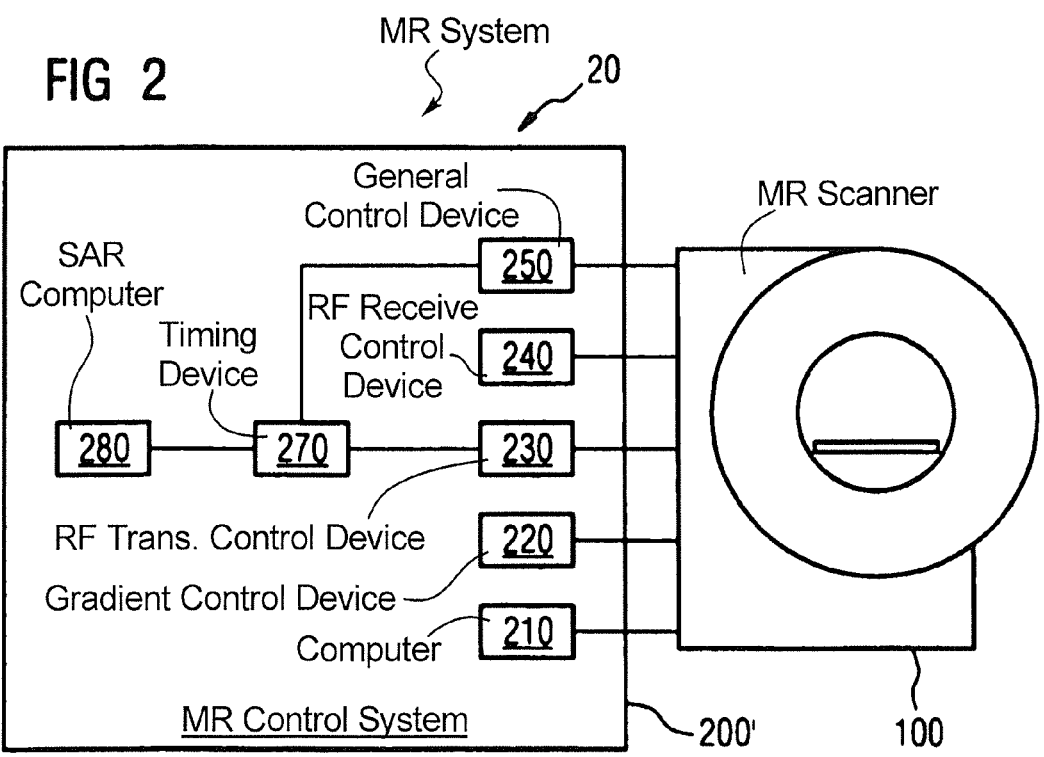

DEVICE, METHOD AND SYSTEM FOR CONTROLLING IMAGING METHODS AND SYSTEMS

BACKGROUND OF THE INVENTION

Field of the Invention

The present invention involves the fields of medical technology and relates especially to controlling or monitoring imaging methods and systems, for example, diagnostic magnetic resonance (MR) methods and MR systems or other systems.

Description of the Prior Art

The diagnostic MR system 10 schematically shown in FIG. 1 comprises an MR system or MR scanner 100 and an MR control system 200.

The MR scanner 100 includes components, such as a gradient array with gradient amplifier and gradients, a transmitter unit (TX unit, radio frequency unit, RF unit) with radio-frequency (RF) amplifier (RF power amplifier, RFPA) and radio-frequency coil and a receiver unit (RX unit) and is controlled by the MR control system 200.

The MR control system 200 includes a computer 210, control devices 220-250 and a real-time computer 260. The control device 220 is used for controlling the gradients of the gradient array. The control device 230 is used for controlling the transmitter unit and processing RF signals in the transmitter unit. The control unit 240 is used to control the receiver unit and digitalize RF signals received in the receiver unit. The control device 250 is used for generally controlling the MR scanner 100.

When operating the MR system 10, the data acquisition process during an examination is controlled by a sequence that precisely determines the moments of gradient activity, radio-frequency pulses and measurements so that MR images can be calculated or reconstructed from MR measurements in the form of MR signals or MR data.

At the same time, for the protection of the patient the MR system 10 has to monitor the local specific absorption rate (SAR) radiated by the transmitter unit. For this purpose, the MR system 10 has a real-time computer 260, for example, a customized device (hardware) and/or programming (software) such as a (measuring) directional coupler with a field programmable gate array (FPGA) for processing and evaluating the (measuring) data in real-time.

Conventionally, it has therefore been necessary to design the device 260 and/or programming for monitoring according to real-time requirements, for example, a real-time operating system because the monitoring process of the SAR has to take place in real-time.

The MR system according to prior art has disadvantageous real-time requirements of the real-time computer 260 or the device and/or programming because they are difficult to implement and/or expensive.

SUMMARY OF THE INVENTION

An object of the present invention is to provide an improved MR system.

Features, advantages and/or alternative embodiments described below can be applied to all aspects of the invention. The method, the system, and the non-transitory, computer-readable storage medium can be further developed with the features described and/or claimed in the context of the device. At the same time, the respective functional features of the device are incorporated by respective appropriate computer-implemented modules, especially microprocessor modules of the system. The device, method and system can be also integrated in the MR control system or MR system in the form of embedded systems.

The terminology used herein is described in more detail, as follows.

An imaging or image processing system is a system, preferably an electronic and/or information technological system for acquiring, processing, evaluating and/or storing image information in the form of image data. For example, to acquire image information, it is possible to use acoustic methods such as ultrasound (US), emission methods such as emission computed tomography (ECT) and positron emission tomography (PET), optical methods, radiological methods such as X-ray tomography and computer tomography (CT), magnetic resonance tomography (MR) or magnetic resonance imaging or combined methods. The image processing system is able to supply two-dimensional (2D) or multi-dimensional such as three-dimensional (3D) or four-dimensional (4D) image data, which are preferably stored and/or processed in different formats. The image processing system can be used in diagnostics, for example, in medical diagnostics.

For example, a central processing unit (CPU) is a microprocessor or digital signal processor (DSP). The central processing unit, which is controlled by the program that can be divided in a plurality of program modules, writes data in the memory, reads data from the memory and processes the data. For example, the central processing unit can be designed as (application) field programmable gate array (FPGA).

The memory can be, for example, read-only memory (ROM) such as electrically erasable programmable read-only memory (EEPROM) or flash-EEPROM, random-access memory (RAM) and disc memory such as hard drive space. The memory can be used for storing a program, for example, an operating program or an application program, and/or data, especially image data, instruction data, configuration data, counter data, protocol data, and sequence data.

An operating system has computer programs that manage system resources (hardware components) of a computer, for example, memory such as user memory and hard drives, input and output devices such as interfaces, and which provides application programs. Thus, the operating system forms an interface between the system resources and the application programs.

A real-time operating system (RTOS) is an operating system with additional real-time functions for strict compliance with time conditions and predictability of process behavior. The real-time operating system has to meet the quantitative real-time requirements attached thereto: when using soft real-time requirements all incoming input are typically processed fast enough, and when using hard real-time requirements a transgression of the response time is evaluated as an error.

One aspect of the invention relates to a computer-implemented method for controlling an imaging system. The method includes calculating a specific absorption rate with a computation means unit and controlling an RF transmission signal of the imaging system with a control device. The process of controlling the RF transmission signal includes disconnecting the RF transmission signal when a remaining period during which the RF transmission signal is harmless for the patient has been reduced to zero.

In accordance with the invention, the local SAR is calculated from measured received signals (for example, RF amplitude and RF phase) using a defined, for example, user-defined, model which, for example, takes into consideration the radio-frequency coil of the MR scanner 100 and the patient. At the same time, an uncritical time lag, i.e., a maximum period during which the RF transmission signal can remain unmonitored without harming the patient, is determined and used so that the processing and evaluation for monitoring can remain in the uncritical range behind the current state. In the process, the uncritical time lag is determined such that the longest time possible is available for processing and evaluation while safe operation of the MR system can be guaranteed at any point in time. As a result, it is possible to calculate the local SAR using a computer without real-time requirements, for example, the control computer or the computer for reconstructing the MR images. At the same time, it is necessary until the end of the uncritical time lag to transmit to the active transmitter unit the calculation results of whether limit values have been reached or exceeded during the current period. For this purpose, a timing device, which is relatively easy to assemble, ensures that the calculation results are transmitted in time to the active transmitter unit or its control device, or the active transmitter unit is disconnected in case the calculation results are lacking.

For example, for each period of, for example, 1 ms that has been examined and evaluated to be safe, the computer can transmit a pulse to the timing device, which increases the value of a counter by 1 for each pulse of the computer. For each transmission period, the transmitter unit or a control system can transmit a pulse to the timing device, which reduces the value of a counter by 1 for each pulse of the transmitter unit. When the counter reaches the value 0 the uncritical time lag has been reached and, as a precaution, the timing device, which is connected with the transmitter unit or its control system, disconnects the active transmitter unit so that the timing device disconnects the transmitter unit after expiration of the uncritical time lag if the result data is lacking or delayed. As a result, by the device and/or by programming for calculating and evaluating the SAR, the local SAR can be monitored in real-time without real-time requirements and without negative effects on the safety of the patient.

In this way, implementation can be simplified and costs reduced because it is not necessary to use any special hardware or special software. For example, the timing device can be installed in the transmitter unit or its control system or other devices of the MR control system, further simplifying implementation and reducing costs. The computer can be controlled such that a calculation of the SAR is made only when the transmitter unit is active, which further reduces costs for resources because the transmitter unit is only active during a short period of the examination.

The computer can be connected with the timing device via a fiber optic connection. The control device can be connected with the timing device also via a fiber optic connection.

The transmitter unit or its control system also can be connected with the timing device by a fiber optic connection.

The invention also encompasses a method wherein the calculation of the specific absorption rate includes calculating a partial result for the specific absorption rate; and increasing the period depending on the partial result.

A further aspect of the invention relates to a method that involves reducing the period depending on the RF transmission signal.

A further aspect of the invention relates to a method wherein the calculation is performed under non-real-time requirements.

A further aspect of the invention relates to a method wherein the control is performed under real-time requirements.

A further aspect of the invention relates to a method wherein the calculation of the specific absorption rate is performed by a computer, in particular a computer for reconstructing images of the imaging system.

A further aspect of the invention relates to a device for controlling an imaging system that includes a computation unit for calculating a specific absorption rate, and a control device for controlling an RF transmission signal of the imaging system. The control device disconnects the RF transmission signal when a remaining period during which the RF transmission signal is harmless for the patient has been reduced to zero.

A further aspect of the invention relates to a device, wherein the calculation of the specific absorption rate includes calculating a partial result for the specific absorption rate; and increasing the period depending on the partial result.

A further aspect of the invention relates to a device that includes a reduction of the period depending on the RF transmission signal.

A further aspect of the invention relates to a device wherein the calculation is performed under non-real-time requirements.

A further aspect of the invention relates to a device wherein the control is performed under real-time requirements.

A further aspect of the invention relates to a device wherein the calculation of the specific absorption rate is performed by a computer, in particular a computer for reconstructing images of the imaging system.

A further aspect of the invention relates to an imaging system that includes any one of the above-mentioned devices for controlling the imaging system.

The present invention also encompasses a non-transitory, computer-readable data storage medium encoded with programming instructions that, when loaded into a computer of a medical imaging system in which a subject is irradiate with RF energy, cause the computer to implement the method according to the invention, including any of the embodiments described above.

Within the scope of the invention the procedural steps do not necessarily have to be performed in the sequence described above. Alternatively, it is also possible, for example, first to complete the process of receiving the information from the transmitting component and then to transmit the received information to the receiving component, instead of transmitting the information coming from the transmitting component directly to the receiving component. In a further embodiment, the procedural steps can be interleaved.

Furthermore, it is possible to design separate portions of the method described above as individually saleable units and the remaining sections of the method as different saleable units. In this way, the method according to the invention can be used as a distributed system of different computer-based entities (for example, client-server entity). For example, it is possible for any module to be composed of different sub-modules that are partially implemented, for example, on the measuring system, partially on the reconstruction system and/or partially on different computer-based entities.

BRIEF DESCRIPTION OF THE DRAWINGS

FIG. 1 schematically illustrates a known MR system.

FIG. 2 schematically illustrates an MR system according to a preferred embodiment of the invention.

DESCRIPTION OF THE PREFERRED EMBODIMENTS

Figure 3:
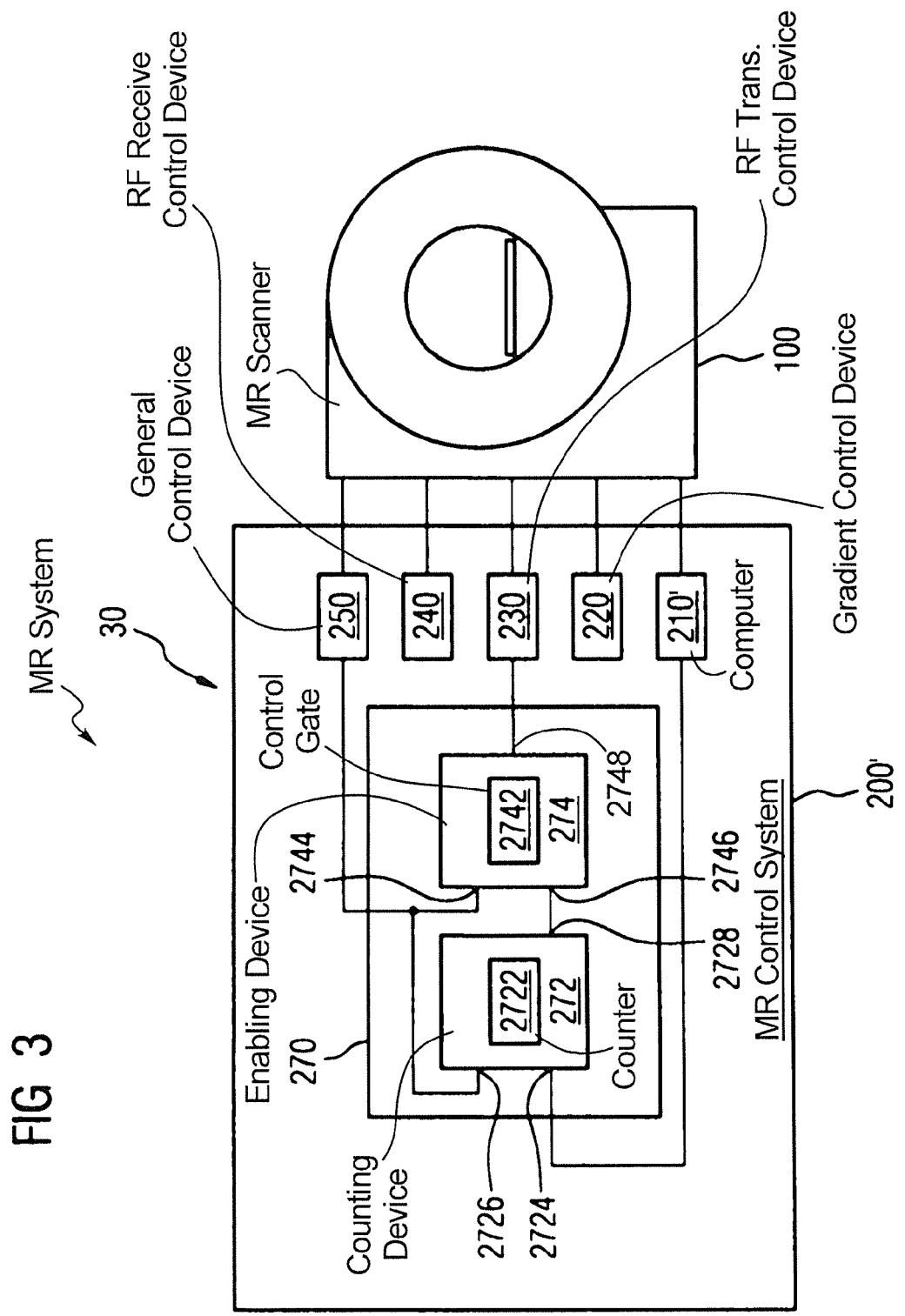
FIG. 3 schematically illustrates an MR system according to a further embodiment of the invention.

FIG. 2 illustrates an MR system 20 according to a preferred embodiment of the invention that includes an MR scanner 100 and an MR control system 200'.

The MR scanner 100 includes devices, such as a gradient array with gradient amplifier and gradients, a transmitter unit (TX unit, radio frequency unit, RF unit) an RF power amplifier, and a radio-frequency coil and a receiver unit (RX unit) and is controlled by the MR control system 200'.

As shown in FIG. 2, the MR control system 200' includes a computer 210 and control devices 220-250. The MR control system 200' can be designed as a distributed control system, for example, an MR control system. The computer 210 can be designed as a measurement and reconstruction computer or a measurement and reconstruction system (MARS). The control device 220 is used for controlling the gradients of the gradient array. The control device 230 is used for controlling the transmitter unit and the RF amplifier and for processing RF signals in the transmitter unit. The control device 240 is used for controlling receiver unit and for digitalizing RF received signals in the receiver unit. A further control device can be used for general communication purposes. The control devices 220-250 can be arranged as close as possible at the respective unit of the diagnostic MR scanner 100.

The computer 210 can comprise a communication interface, a processor, a user memory and a memory. The user memory can store an operating system, an application program and data, for example, a sequence. The memory can be used for storing MR data, for example, MR raw data and MR image data. The computer 210 is connected with its communication interface via a connection with the MR scanner 100. Furthermore, the computer 210 can include an input device for receiving input of a user and/or an output device for issuing information to the user. The computer 210 can be used for acquiring, processing and performing a measurement command. For this purpose, the computer 210 downloads the sequence and supplies instructions for the MR system/scanner 100. For example, the computer 210 can be designed as a powerful workstation.

The instructions are used for controlling the gradients of the gradient array, controlling the transmitter unit and RF amplifier and for processing RF signals in the transmitter unit or for controlling the receiver unit and digitalizing RF received signals in the receiver unit.

When operating the MR system 20, the measuring process during the examination is precisely determined, controlled by the sequence, the points of gradient activity, radio-frequency pulses and measurements so that MR images can be calculated or reconstructed from MR measurements in the form of MR signals or MR data.

Furthermore, for the protection of the patient, the MR control system 200' comprises a timing device 270 and a device and/or programming for calculating and evaluating the local specific absorption rate (SAR) coming from the transmitter unit.

FIG. 2 shows that the device and/or programming for calculating and evaluating the SAR can be designed in the form of a computer 280. For example, as described above with regard to computer 210, the computer 280 can comprise a communication interface, a processor, a user memory, a memory, an input device and/or output device. The computer 280 is used for calculating and evaluating from measured received signals (for example, RF amplitude and RF phase) the SAR by means of a defined, for example, user-defined model which, for example, takes into consideration the radio-frequency coil of the MR scanner 100 and the patient. During the process of calculating and evaluating the SAR with the computer 280, it is possible to use an uncritical time lag, i.e., a maximum period in which the RF transmission signal can remain unmonitored without harming the patient because the processing and evaluation for monitoring can remain in the uncritical range behind the current state. In the process, the uncritical time lag is determined such that the longest time possible is available for processing and evaluation, while safe operation of the MR system 20; 30 can be guaranteed at any point in time. As a result, the calculation and evaluation of the SAR can be performed with the computer 280 without placing real-time requirements on the computer 280. Furthermore, the computer 280 can be controlled in such a way the calculation of the SAR is made only when the transmitter unit is active so that the costs for resources can be further reduced because the transmitter unit is only active during a short period of the examination. The computer 280 is connected with the timing device 270. The computer 280 can be connected with the timing device 270 via a fiber optic connection.

The timing device 270 ensures that the calculation results are transmitted in a timely manner to the active transmitter unit or its control device 230, or it disconnects the active transmitter unit when the calculation results are lacking. For this purpose, the timing device 270 can be connected with the control device 250. For example, the timing device 270 can be connected with the control device 250 by means of a fiber optic connection. Furthermore, the timing device 270 can be connected with the transmitter unit or its control device 230. For example, the timing device 270 can be connected with the transmitter unit or its control device 230 by means of a fiber optic connection. At the same time, the timing device 270 can, for example, calculate at any time the period of the RF transmission operation against the period which the computer has assessed until then to be safe and thus guarantee in real-time the safety of the patient. The timing device 270 fulfills real-time requirements. The timing device 270 is constructed in comparatively simple manner, for example, in the form of a logic circuit. For example, the timing device 270 can be installed in the control device 250, the transmitter device or its control device 230 or any other device of the MR control system 200' so that implementation is further simplified, further reducing costs.

For example, for each period of, for example, 1 ms or 2 ms that has been examined and assessed to be safe, the computer 280 can transmit an impulse to the timing device 270 which increases a counter by the value 1 for each impulse of the transmission operation, and the control system 250 can transmit for each transmission period an impulse to the timing device 270, which reduces the counter by the value 1 for each impulse of the transmission operation. When the counter has reached the value 0, the uncritical time lag is reached (expired), and the timing device 270 determines—directly or indirectly—to disconnect the active transmitter unit so that the timing device 270 disconnects the transmitter unit after expiration of the uncritical time lag if the result data is lacking or delayed.

As a result, the local SAR can be monitored in real-time by the computer 280 without real-time requirements and without negative effects for the safety of the patient.

With reference to FIG. 2, FIG. 3 shows an MR system 30 according to a further embodiment of the invention.

FIG. 3 shows that the timing device 270 can comprise a counting device 272 with a counter 2722 and an enabling device 274 with a control gate 2742, for example, an AND gate. The counting device 272 comprises an incrementing or "positive" input 2724, a decrementing or "negative" input 2726 and an output 2728. Signals, for example, impulses, at the positive input 2724 increase the value of the counter 2722 so that the device and/or programming for calculating and evaluating the SAR, the output of which is connected with the positive input 2724, can increase (load) the value of the counter 2722 by means of signals at its output which indicate their activity. When the counter 2722 has a value greater than zero, the counting device 272 enables a signal at its output 2728. Signals, for example, impulses at its negative input 2726, reduce the value of the counter 2722 so that, as shown in FIG. 3, the control device 250, the output of which is connected with the negative input 2726, can reduce (unload) the value of the counter 2722 by means of signals at its output which indicate the activity of the transmitter unit, the RF amplifier and/or radio-frequency coil. When the counter 2722 reaches the value zero, the uncritical time lag has expired and the counting device 272 disconnects the signal at its output 2728. As a result, the counting device 272 can evaluate at any time the period of the RF transmission operation against the period which the device and/or programming for calculating and evaluating the SAR assessed until then (and thus enabled) to be as safe and thus guarantee the safety of the patient in real-time.

The enabling device 274 comprises a first input 2744, a second input 2746 and an output 2748.

A signal at the first input 2744 indicates instructions for activating the RF transmission signal so that, as shown in FIG. 3, the control device 250, the output of which is (also) connected with the first input, can indicate the activity of the transmitter unit, the RF amplifier and/or the radio-frequency coil. A signal at the second input 2746 indicates the operation of the transmitter unit assessed to be safe (and thus enabled) so that the device and/or programming for calculating and evaluating the SAR, the output of which is connected with the second input 2746, can enable or possibly disable the operation of the transmitter unit, the RF amplifier and/or the radio-frequency coil. At the same time, as described, the control gate 2742 can be designed in the form of an AND gate, for example an AND gate with two inputs, the output of which is only activated (active, logic 1) when all inputs are activated (active, logic 1). Alternatively, the control gate 2742 can comprise one or several gates, for example NAND and/or NOR gates in order to from the function, i.e., an enable function. At the same time, it is possible to use positive logic or negative logic at the control gate 2742. Furthermore, the control gate 2742 can be designed with optical elements, especially when, as described above, the timing device 270 is connected by means of one or several fiber optic connections.

FIG. 3 shows that the device and/or programming for calculating and evaluating the SAR can be implemented by the available computer 210' which, compared with computer 210, additionally performs the calculation and evaluation of the SAR so that computer 280 can be eliminated. At the same time, the calculation and evaluation of the SAR can take priority over other functions of computer 210'

Although modifications and changes may be suggested by those skilled in the art, it is the intention of the inventors to embody within the patent warranted hereon all changes and modifications as reasonably and properly come within the scope of their contribution to the art.

We claim as our invention:

1. A computer-implemented method for controlling an imaging system:

from an RF radiator in the imaging system, radiating RF energy corresponding to an RF transmission signal supplied to said RF radiator from a control computer;

in said control computer, calculating a specific absorption rate for a patient exposed to said RF energy radiated in said imaging system;

in control said computer determining, from said specific absorption rate, a length of time during which radiation of said RF energy in said imaging system does not harm the examination subject; and in said control computer, monitoring said duration during radiation of said RF energy in said imaging system and automatically disconnecting said RF transmission signal when said duration has been reduced to zero.

2. A method as claimed in claim 1 comprising calculating said specific absorption rate by calculating a partial result for said specific absorption rate, and increasing said length of time dependent on said partial result.

3. A method as claimed in claim 1 comprising reducing said length of time dependent on said RF transmission signal.

4. A method as claimed in claim 1 comprising calculating said specific absorption rate under non-real time requirements.

5. A method as claimed in claim 1 comprising controlling said radiation of said RF energy under real-time requirements.

6. A method as claimed in claim 1 wherein said computer is also configured to reconstruct an image of the examination subject from image data acquired by said imaging system.

7. A computerized device for controlling an imaging system:

a control computer configured to generate an RF signal for operating an RF radiator in the imaging system, and to supply said RF transmission signal supplied to said RF radiator to cause said RF radiator to radiate RF energy corresponding to said RF transmission signal;

a computerized calculation unit configured to calculate a specific absorption rate for a patient exposed to said RF energy radiated in said imaging system;

said control computer being configured to determine, from said specific absorption rate, a length of time during which radiation of said RF energy in said imaging system does not harm the examination subject; and said control computer being configured to monitor said duration during radiation of said RF energy in said imaging system and to automatically disconnect said RF transmission signal when said duration has been reduced to zero.

8. A device as claimed in claim 7 comprising wherein said calculation unit is configured to calculate said specific absorption rate by calculating a partial result for said specific absorption rate, and wherein said control computer is configured to increase said length of time dependent on said partial result.

9. A device as claimed in claim 7 wherein said control computer is configured to also reduce said length of time dependent on said RF transmission signal.

10. A device as claimed in claim 7 wherein said calculation unit is configured to calculate said specific absorption rate under non-real time requirements.

11. A device as claimed in claim 7 wherein said control computer is configured to control said radiation of said RF energy by said RF radiator under real-time requirements.

12. A device as claimed in claim 7 wherein said control computer is also configured to reconstruct an image of the examination subject from image data acquired by said imaging system.

13. An imaging system comprising:
- an RF radiator that radiates RF energy into an examination subject dependent on an RF transmission signal supplied to said RF radiator;
- a control computer configured to generate the RF transmission signal for operating said RF radiator, and to supply said RF transmission signal supplied to said RF radiator to cause said RF radiator to radiate RF energy corresponding to said RF transmission signal;
- a computerized calculation unit configured to calculate a specific absorption rate for a patient exposed to said RF energy radiated in said imaging system;
- said control computer being configured to determine, from said specific absorption rate, a length of time during which radiation of said RF energy in said imaging system does not harm the examination subject; and
- said control computer being configured to monitor said duration during radiation of said RF energy in said imaging system and to automatically disconnect said RF transmission signal when said duration has been reduced to zero.

14. A non-transitory, computer-readable data storage medium encoded with programming instructions, said storage medium being loaded into a computer of an imaging system, said imaging system comprising an RF radiator that radiates RF energy into an examination subject, said programming instructions causing said computer to:
- generate an RF transmission signal for operating said RF radiator, and supply said RF transmission signal to said RF radiator to cause said RF radiator to radiate RF energy corresponding to said RF transmission signal;
- calculate a specific absorption rate for a patient exposed to said RF energy radiated in said imaging system;
- determine, from said specific absorption rate, a length of time during which radiation of said RF energy in said imaging system does not harm the examination subject; and
- monitor said duration during radiation of said RF energy in said imaging system and automatically disconnect said RF transmission signal when said duration has been reduced to zero.

* * * * *